(12) United States Patent
Jory et al.

(10) Patent No.: US 7,312,992 B2
(45) Date of Patent: Dec. 25, 2007

(54) APPARATUS AND METHOD FOR TRANSFERRING HEAT FROM PROCESSORS

(75) Inventors: Edward M. Jory, Huntsville, AL (US); David S. Slaton, Huntsville, AL (US)

(73) Assignee: General Electric Company, Schenectady, NY (US)

( * ) Notice: Subject to any disclaimer, the term of this patent is extended or adjusted under 35 U.S.C. 154(b) by 289 days.

(21) Appl. No.: 10/999,725

(22) Filed: Nov. 30, 2004

(65) Prior Publication Data

US 2006/0114652 A1    Jun. 1, 2006

(51) Int. Cl.
*H05K 7/20* (2006.01)

(52) U.S. Cl. .................. 361/696; 361/694; 361/695; 454/184

(58) Field of Classification Search .......... 361/687, 361/694–695; 454/184
See application file for complete search history.

(56) References Cited

U.S. PATENT DOCUMENTS

| | | | |
|---|---|---|---|
| 4,858,069 A * | 8/1989 | Hughes ..................... 361/696 |
| 5,598,320 A | 1/1997 | Toedtman et al. .......... 361/687 |
| 5,734,550 A | 3/1998 | Penniman et al. .......... 361/687 |
| 6,134,110 A | 10/2000 | Langari ..................... 361/700 |
| 6,262,892 B1 * | 7/2001 | Bhatia ....................... 361/695 |
| 6,657,859 B1 * | 12/2003 | Karr ......................... 361/687 |
| 2006/0171115 A1 * | 8/2006 | Cramer ..................... 361/695 |

* cited by examiner

*Primary Examiner*—Gregory D Thompson
(74) *Attorney, Agent, or Firm*—Cantor Colburn LLP

(57) ABSTRACT

A heat exchange apparatus having a housing that includes a first region and a second region, and a wall separating the first region from the second region, is disclosed. The second region includes a fluid flow entry port and a fluid flow exit port to define a fluid flow path, and a heat exchanger exposed to the fluid flow path. The heat exchanger includes first and second portions in thermal communication with each other, where the first portion is disposed at the first region and the second portion is disposed at the second region. The fluid flow path is isolated from the first region and provides for the removal of heat from the first region.

12 Claims, 4 Drawing Sheets

APPARATUS AND METHOD FOR TRANSFERRING HEAT FROM PROCESSORS

BACKGROUND OF THE INVENTION

The present disclosure relates generally to an apparatus and method for transferring heat, particularly to an apparatus and method for transferring heat from processors, and more particularly to an apparatus and method for transferring heat from high-speed processors in enclosures having a 1U form factor.

High-speed processors in small enclosures are becoming more and more prevalent in today's electronic applications, which invariably results in a demand for higher thermal dissipation in an increasingly smaller space. Traditional thermal designs have relied on the dissipation of heat from the top surface of an active processor through a heatsink that needs to be very tall relative to the enclosure in which it operates. More recent thermal designs have relied on a heat-pipe arrangement that transfers the heat away from the top side of an active processor to a location where a tall heatsink may be placed. Even more recent thermal designs have relied on fans, duct work, and shrouding to produce a wind tunnel effect that pulls cool air directly over a heatsink installed on top of an active processor. While existing thermal designs may be suitable for their intended purpose, there still remains a need in the electronic art for high efficiency cooling of high-speed processors in small enclosures, such as enclosures having a 1U form factor.

BRIEF DESCRIPTION OF THE INVENTION

Embodiments of the invention include a heat exchange apparatus having a housing that includes a first region and a second region, and a wall separating the first region from the second region. The second region includes a fluid flow entry port and a fluid flow exit port to define a fluid flow path, and a heat exchanger exposed to the fluid flow path. The heat exchanger includes first and second portions in thermal communication with each other, where the first portion is disposed at the first region and the second portion is disposed at the second region. The fluid flow path is isolated from the first region and provides for the removal of heat from the first region.

Other embodiments of the invention include a method of transferring heat from a processor. Heat from a first surface in a first region is transferred to a second surface in a second region, the processor being in thermal communication with the first surface and the second region being fluidly separated from the first region by a partition. Heat from the second surface in the second region is transferred to a fluid flow in the second region, the fluid flow in the second region having a flow path isolated from the first region. The fluid is caused to flow from an entry port at the second region to an exit port at the second region thereby resulting in the transfer of heat from the processor in the first region to the fluid flow in the second region independent of an air flow in the first region.

BRIEF DESCRIPTION OF THE DRAWINGS

Referring to the exemplary drawings wherein like elements are numbered alike in the accompanying Figures.

DETAILED DESCRIPTION OF THE INVENTION

Embodiments of the invention provide an electronic enclosure for transferring heat from a processor in a first region of the enclosure to an ambient external of the enclosure by utilizing a fluid flow in a second region of the enclosure that is in fluid isolation from an air flow in the first region. The fluid flow in the second region may be air or a heat transfer liquid.

Figure 1:
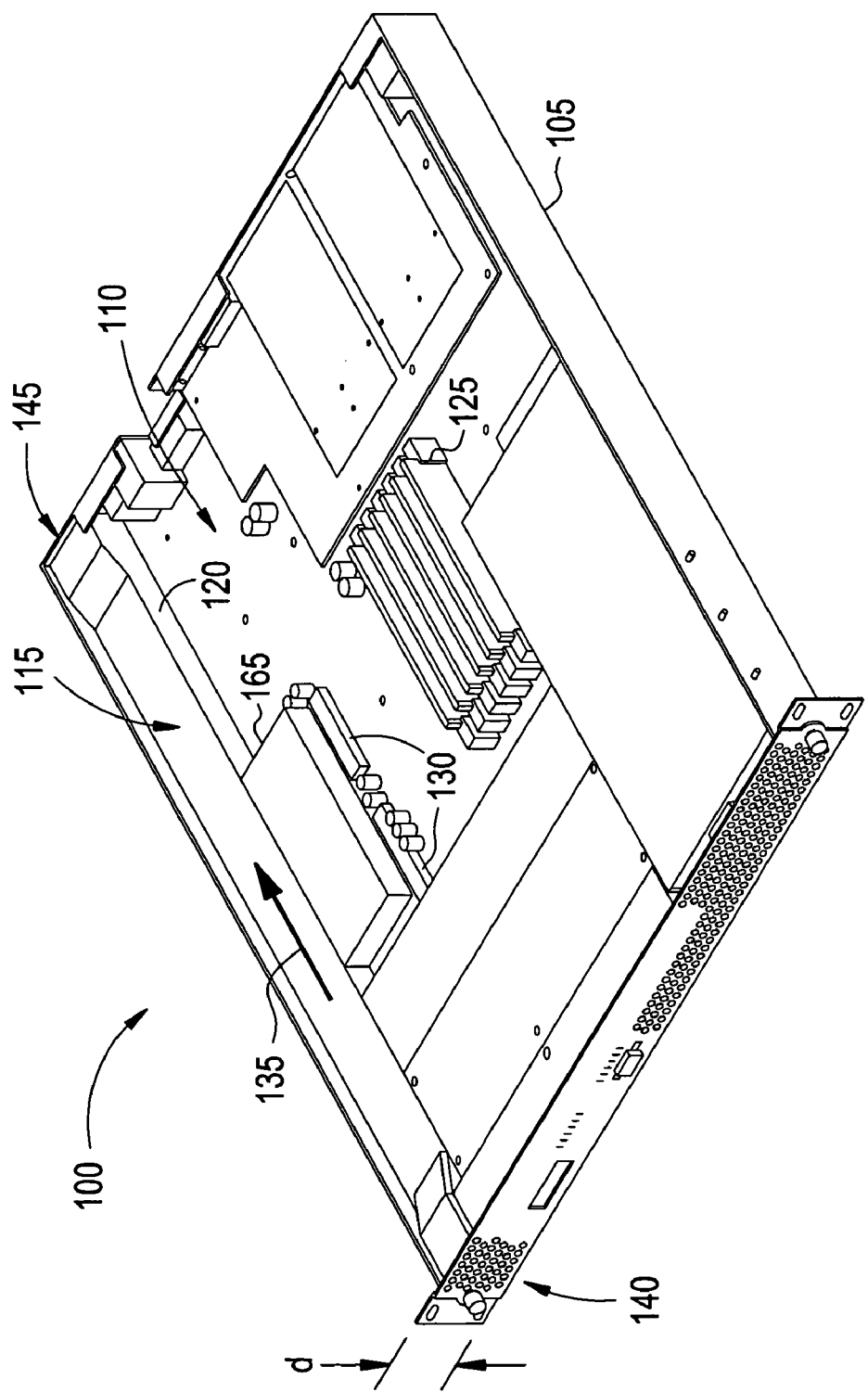
FIG. 1 depicts an isometric view of an exemplary enclosure, with cover removed, in accordance with embodiments of the invention.
Figure 2:
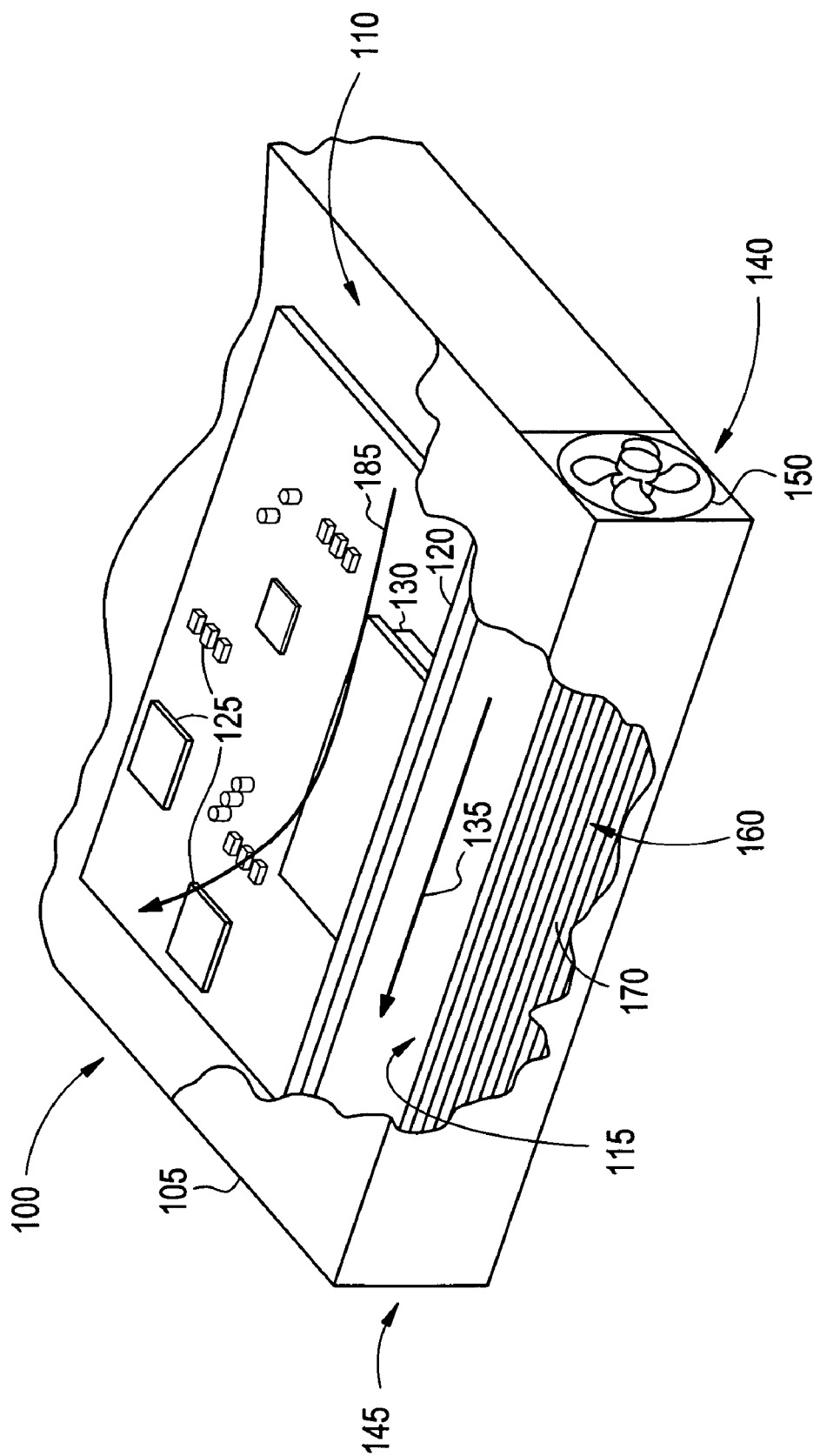
FIG. 2 depicts a partial isometric view of the exemplary enclosure of FIG. 1, with the cover partially cutaway and the internal components illustrated in simple block form.

FIG. 1 is an exemplary embodiment of an electronic enclosure 100, also herein referred to as a heat exchange apparatus, having a housing 105 that defines a first region 110 and a second region 115, separated by a wall or partition 120. In an embodiment, enclosure 100 is of a type that utilizes high-speed processors and has a thickness dimension "d" of about 1.75 inches, which is referred as a 1U form factor. While embodiments of the invention may describe an enclosure having a 1U form factor with high-speed heat-generating processors disposed therein, it will be appreciated that the scope of the invention is not so limited, and that embodiments of the invention also include other form factors, such as 2U (two times a 1U form factor), 4U (four times a 1U form factor), ATX (a standard motherboard form factor), tower (a standard motherboard form factor), or any other enclosure configuration where the cooling of a heat-generating device, such as a processor, is desired. FIG. 2 is a partial view of the enclosure 100 of FIG. 1, with the internal electronic components illustrated in a simple block structure.

Figure 3:
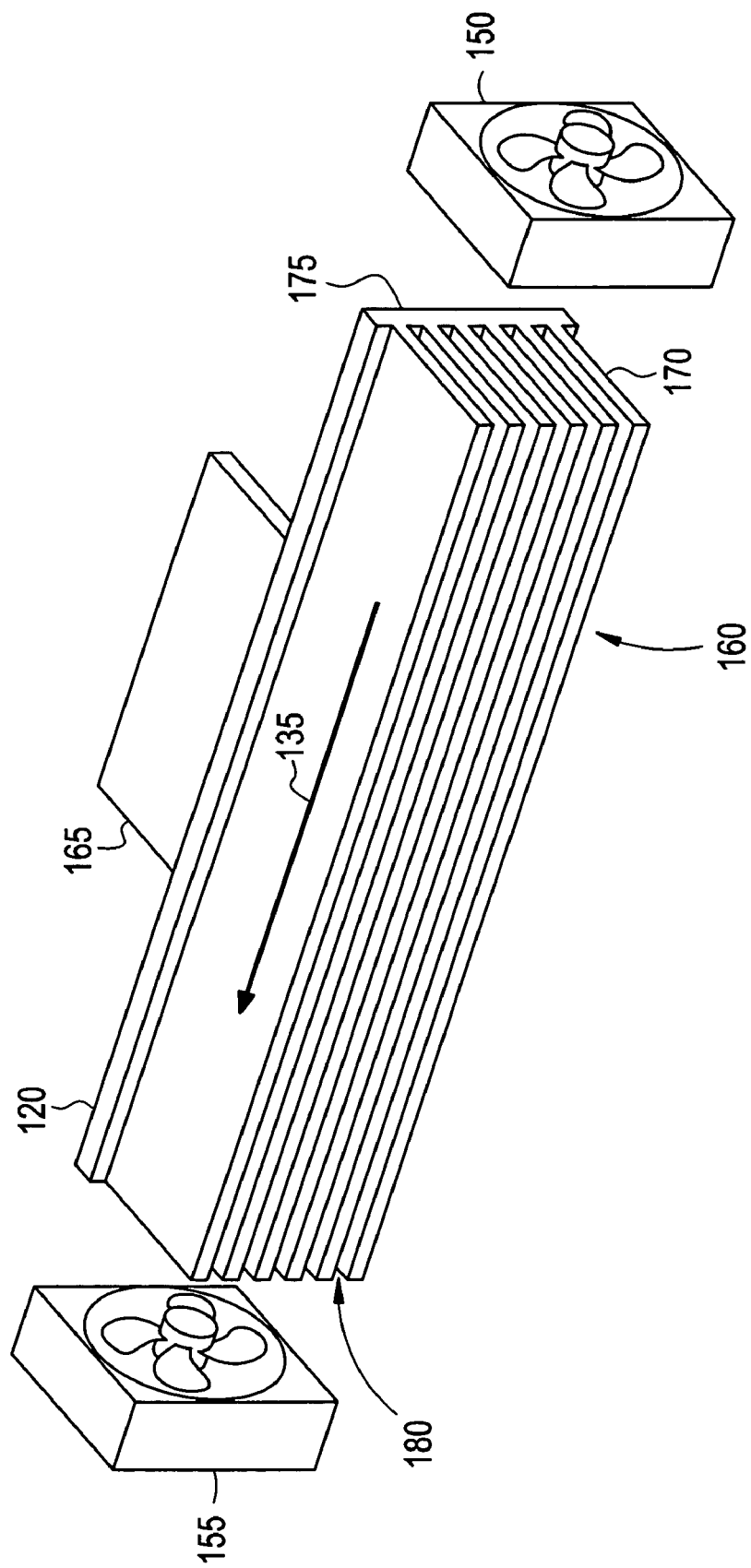
FIG. 3 depicts in isometric view portions of the enclosure of FIGS. 1 and 2 in accordance with embodiments of the invention.

Referring to FIGS. 1 and 2 in combination, the first region 110 defines a region for housing electronic components, depicted generally by reference numeral 125, and processors 130. While embodiments of the invention may depict only two processors 130, it will be appreciated that the scope of the invention is not so limited, and that embodiments of the invention include any number of processors 130 that may be cooled in accordance with the means and methods disclosed herein. The second region 115 defines a region for providing a fluid flow path depicted generally by reference numeral 135. At one end of second region 115 is a fluid flow entry port 140, and at an opposite end of second region 115 is a fluid flow exit port 145. In an embodiment, fans (more generally referred to as fluid flow drivers) 150, 155, best seen by also referring to FIG. 3, are disposed at the entry and exit ports 140, 145, respectively, for driving an air flow along flow path 135. While embodiments of the invention disclose a fan 150, 155 as an exemplary air flow driver, it will be appreciated that the scope of the invention is not so limited, and that other fluid flow drivers, such as a liquid pump for example, may be employed as discussed later with reference to FIG. 4. In an exemplary embodiment, the fan driven air flow at flow path 135 serves to provide a wind tunnel effect in the second region 115 for producing a high cooling efficiency within apparatus 100. A heat exchanger (heatsink) 160 is disposed within the second region 115 and is exposed to the air flow of fluid flow path 135. While embodiments of the invention depict fans 150, 155 at both the entry and exit ports 140, 145, it will be appreciated that there may be only one fan at either the entry or the exit port. Additionally, and where the enclosure 100 has the fluid flow path 135 oriented vertical, natural convection may enable some embodiments of the invention to be absent the fans altogether. However, embodiments of the invention preferably include fans 150, 155 for forcing the air to flow through heat exchanger 160 at a rate exceeding the flow rate of air under natural convection conditions, thereby establishing a wind tunnel effect.

The heat exchanger 160 includes a first portion (processor attachment plate) 165 that extends into the first region 110, and a second portion (heat transfer fins) 170 that extends into the second region 115. In an embodiment, a baseplate 175 of heat exchanger 160 provides the wall 120 that partitions off the first region 110 from the second region 115. The wall 120 serves to create a thermal barrier between the high temperature air flowing out of the wind tunnel of the second region 115 from the air flowing over the electronic components within the first region 110. While heat exchanger 160 is depicted with baseplate 175 providing the partitioning wall 120, it will be appreciated that an alternative embodiment may have the heat exchanger 160 rotated 90 degrees about its longitudinal axis such that a heat transfer fin 170 provides the partitioning wall 120. In either case, the wall 120 that separates the first region 110 from the second region 115 is preferably defined by a surface of the heat exchanger 160. Processors 130 and first portion (processor attachment plate) 165 are arranged to be in thermal communication with each other, by using thermally conductive adhesive, thermally conductive potting agent, or other suitable means, for thermally attaching processors 130 to an underside surface of first portion 165. The first portion 165, the baseplate 175, and the second portion (heat transfer fins) 170 are all in thermal communication with each other, thereby providing a thermal conduction path from the first portion 165 to the second portion 170. By providing a wall or partition 120 between the first region 110 and the second region 115, the fluid flow path 135 provides an air flow that is isolated from the first region 110 while still providing for the removal of heat from the processors 130 at the first region 110. As depicted in FIGS. 2 and 3, the heat transfer fins of second portion 170 are configured to define longitudinal fluid flow channels 180 that extend from the entry port 140 to the exit port 145, thereby enabling air to flow along flow path 135 under the action of both free and forced convection.

With reference to FIG. 2, the electronic components 125 in first region 110 may have associated with them a second air flow 185, which may be a result of natural convection air currents resulting from operation of the electronic components 125 themselves, or by other air flow driving means. However, in accordance with embodiments of the invention, baseplate 175 serves to keep this second air flow 185 isolated from the flow path 135 at the second region 115.

In view of the foregoing discussion relating to the structure of enclosure 100, the configuration of heat exchanger 160 in combination with housing 105 provides for an effective method of transferring heat from processors 130 to the ambient outside of enclosure 100. In an embodiment, this method involves transferring heat from a first surface (the underside of first portion 165) in a first region 110 to a second surface (heat transfer fins 170) in a second region 115, transferring heat from the second surface in the second region 115 to an air flow (flow path 135) in the second region 115, and causing the air to flow from an entry port 140 at the second region 115 to an exit port 145 at the second region 115, thereby resulting in the transfer of heat from the processors 130 in the first region 110 to the air flow 135 in the second region 115 independent of a second air flow 185 in the first region 110.

Figure 4:
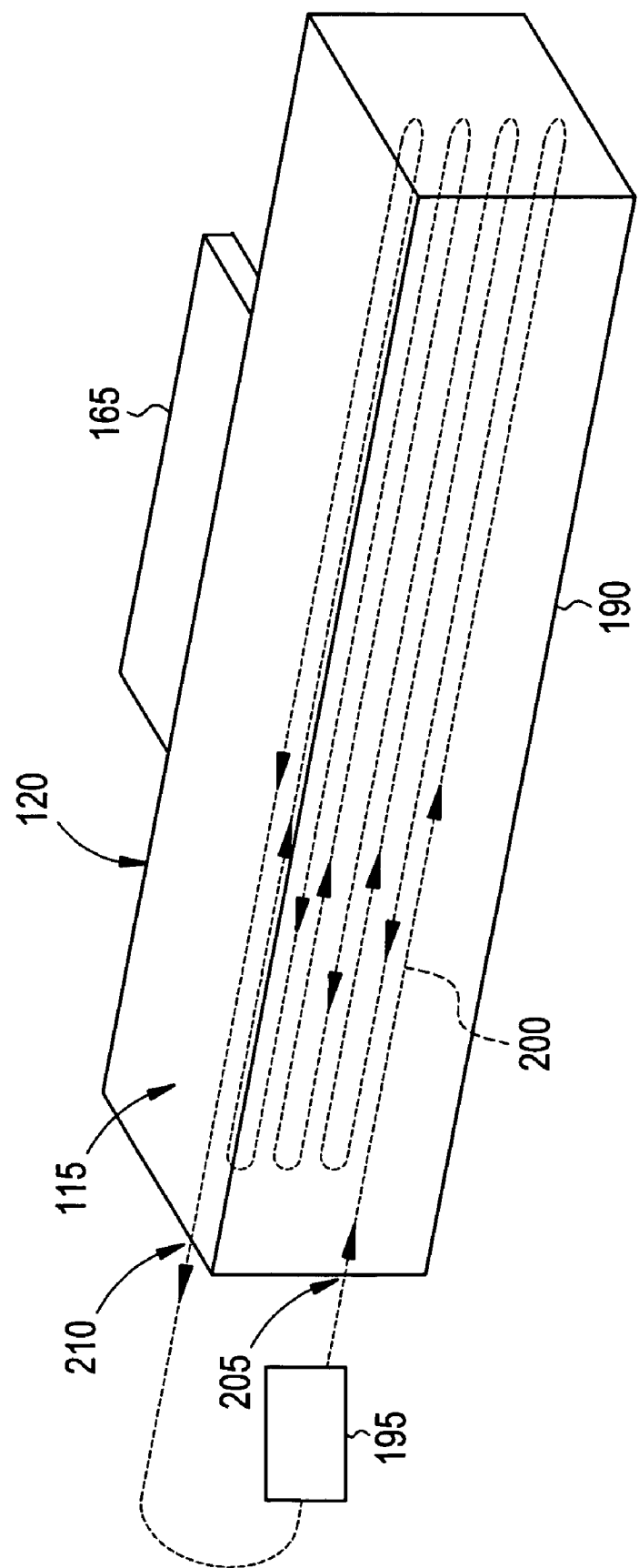
FIG. 4 depicts in isometric view an alternative embodiment to that depicted in FIG. 3.

In an alternative embodiment, with reference now being made to FIG. 4, the heat exchanger 160 and fans 150, 155 depicted in FIG. 3 may be replaced by a heat exchanger 190 and a fluid flow driver 195. In an embodiment, fluid flow driver 195 is a combination fluid pump and heat exchanger having operational components that are known to one skilled in the art. In the embodiment of FIG. 4, heat exchanger 190 defines the aforementioned second region 115, which receives heat from processors 130 in thermal communication with the underside of first portion 165 in first region 110. In an embodiment, heat exchanger 190 is a thermal mass, such as a metal block for example, having a fluid flow path 200 disposed therein (depicted generally by the serpentine dotted line with flow direction arrows), which is similar to fluid flow path 135 of FIGS. 1-3. An exterior surface of the thermal mass defines the separating wall 120 between first and second regions 110, 115. As depicted in FIG. 4, fluid flow path 200 has a fluid flow entry port 205 and a fluid flow exit port 210 at the same end of heat exchanger 190, and is arranged as a closed loop path with the combination fluid pump/heat exchanger 195 being arranged in-line therewith. In this manner, the fluid in fluid flow path 200 may be viewed as circulating through heat exchanger 190 rather than merely flowing through it. The entry and exit ports 205, 210 may be disposed at any convenient location. The secondary heat exchanger of the combination fluid pump/heat exchanger 195 serves to transfer heat from the fluid in fluid path 200 to an ambient external of enclosure 100. The fluid in fluid path 200 may be any suitable fluid for transporting heat from heat exchanger 190 to combination fluid pump/heat exchanger 195. While embodiments of the invention depict combination fluid pump/heat exchanger 195 as an integrated unit, it will be appreciated that the scope of the invention is not so limited and that separate units may be employed for each function of the combination fluid pump/heat exchanger.

As disclosed, some embodiments of the invention may include some of the following advantages: a high cooling efficiency electronic enclosure having a small enclosed structure by integrally incorporating the heatsink into the structure of the enclosure; a high cooling efficiency electronic enclosure by incorporating a wind tunnel effect at the heat exchanger; a high cooling efficiency electronic enclosure by incorporating a thermal barrier between the high temperature air flowing out of the wind tunnel from the air flowing over the electronic components themselves; a high cooling efficiency in a thin electronic enclosure by exposing a large surface area to cool air drawn through a wind tunnel; a high cooling efficiency electronic enclosure having low labor and material cost by integrally arranging the heat exchanger with the enclosure structure and eliminating the need for additional air flow shrouds and ducts; and, a high cooling efficiency electronic enclosure in a 1U form factor.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best or only mode contemplated for carrying out this invention, but that the invention will include all embodiments falling within the scope of the appended claims. Moreover, the use of the terms first, second, etc. do not denote any order or importance, but rather the terms first, second, etc. are used to distinguish one element from another. Furthermore, the use of the terms a, an, etc. do not denote a limitation of quantity, but rather denote the presence of at least one of the referenced item.

What is claimed is:

1. A heat exchange apparatus, comprising:
a housing having a first region and a second region, and a wall separating the first region from the second region;
wherein the second region comprises a fluid flow entry port, a fluid flow exit port, thereby defining a fluid flow path, the second region further comprising a fluid flow driver at the entry port, a fluid flow driver at the exit port, and a heat exchanger, wherein the heat exchanger is exposed to the fluid flow path;
wherein the heat exchanger comprises a first portion disposed at the first region, and a second portion disposed at the second region, the first portion being in thermal communication with the second portion; and
wherein the fluid flow path is isolated from the first region and provides for the removal of heat from the first region.

2. The apparatus of claim 1, wherein:
the wall separating the first region from the second region is defined by a surface of the heat exchanger.

3. The apparatus of claim 2, wherein:
the second portion of the heat exchanger comprises a baseplate and a set of heat transfer fins in thermal communication with the baseplate, the baseplate being the surface of the heat exchanger that defines the separating wall.

4. The apparatus of claim 3, wherein:
the heat transfer fins are configured to define longitudinal fluid flow channels extending from the entry port to the exit port.

5. The apparatus of claim 2, wherein:
the second portion of the heat exchanger comprises a thermal mass having a fluid flow path disposed therein, an exterior surface of the thermal mass defining the separating wall.

6. The apparatus of claim 1, wherein:
the fluid comprises air.

7. The apparatus of claim 1, wherein:
the first region comprises a set of electronic components including a processor; and
the first portion of the heat exchanger comprises a surface in thermal communication with the processor.

8. The apparatus of claim 7, wherein:
the set of electronic components has an associated air flow in fluid communication therewith that is isolated from the fluid flow path of the second region.

9. The apparatus of claim 1, wherein:
the housing comprises a 1U form factor.

10. A method of transferring heat from a processor, comprising:
transferring heat from a first surface in a first region to a second surface in a second region, the processor being in thermal communication with the first surface, the second region being fluidly separated from the first region by a partition;
transferring heat from the second surface in the second region to a fluid flow in the second region, the fluid flow in the second region having a flow path isolated from the first region; and
causing the fluid to flow from an entry port at the second region to an exit port at the second region by way of a fluid flow driver at the entry port and a fluid flow driver at the exit port, thereby resulting in the transfer of heat from the processor in the first region to the fluid flow in the second region independent of an air flow in the first region.

11. The method of claim 10, wherein the fluid comprises air, and the causing the air to flow comprises:
forcing the air to flow at a rate exceeding the flow rate of air under natural convection conditions.

12. The method of claim 11, further comprising:
performing the transfer of heat from the processor in an enclosure having a 1U form factor.

* * * * *